ns us010653028B2

(12) United States Patent
Su

(10) Patent No.: US 10,653,028 B2
(45) Date of Patent: May 12, 2020

(54) CONNECTOR EQUIPPED WITH CARRIER FRAME AND RAIL FRAME FOR CPU

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventor: Po-Yuan Su, New Taipei (TW)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 16/374,757

(22) Filed: Apr. 4, 2019

(65) Prior Publication Data

US 2019/0313543 A1 Oct. 10, 2019

(30) Foreign Application Priority Data

Apr. 4, 2018 (CN) .......................... 2018 1 0297493

(51) Int. Cl.
*H01R 12/71* (2011.01)
*H01R 13/502* (2006.01)
*H01R 13/639* (2006.01)
*H05K 7/10* (2006.01)
(Continued)

(52) U.S. Cl.
CPC ............... *H05K 7/10* (2013.01); *H01R 12/71* (2013.01); *H01R 13/24* (2013.01); *H01R 13/502* (2013.01); *H01R 13/639* (2013.01); *H05K 7/1417* (2013.01); *H05K 7/1461* (2013.01)

(58) Field of Classification Search
CPC .... H01R 12/70; H01R 12/7076; H01R 12/71; H01R 12/712; H01R 12/716; H01R 12/88; H01R 13/504; H01R 13/62994; H05K 7/10; H05K 7/12; H05K 3/301; H05K 2201/10325; H05K 2201/10393
See application file for complete search history.

(56) References Cited

U.S. PATENT DOCUMENTS 7,033,198 B2 * 4/2006 Chiang ................ H05K 7/1007
439/331
7,101,210 B2 * 9/2006 Lin ...................... H05K 7/1061
439/331
(Continued)

FOREIGN PATENT DOCUMENTS

CN 103515764 B 3/2016
CN 205944491 U 2/2017

*Primary Examiner* — Vanessa Girardi
(74) *Attorney, Agent, or Firm* — Wei Te Chung; Ming Chieh Chang

(57) ABSTRACT

An electrical connector includes a stiffener, a rail frame pivotally mounted to one end of the stiffener, a carrier frame assembled to the rail frame in a sliding manner, and a load plate pivotally mounted to the end of the stiffener outside of the rail frame. The carrier frame includes latches to retain the CPU thereon. The rail frame includes a pair of opposite sliding channels extending in the front-to-back direction, along which the carrier frame is moveable. A front transverse bar is located in front of the sliding channels and above the sliding channels in the vertical direction.

19 Claims, 9 Drawing Sheets

(51) Int. Cl.
*H01R 13/24* (2006.01)
*H05K 7/14* (2006.01)

(56) References Cited

U.S. PATENT DOCUMENTS

| 7,819,689 B2 * | 10/2010 | Fan | H05K 7/10 |
| | | | 439/331 |
| 10,116,076 B2 * | 10/2018 | Liao | H01R 12/88 |
| 2019/0245287 A1 * | 8/2019 | Su | H01R 12/712 |

* cited by examiner

CONNECTOR EQUIPPED WITH CARRIER FRAME AND RAIL FRAME FOR CPU

BACKGROUND OF THE INVENTION

1. Field of the Invention

The present invention relates generally to an electrical connector, and more particularly to the connector connecting a CPU (Central Processing Unit) to a PCB (Printed Circuit Board). The instant application relates to a copending application Ser. No. 16/258,687 filed Jan. 28, 2019.

2. Description of Related Arts

China Patent No. 205944491, the inventor's previous design, discloses an electrical connector equipped with a pivotal rail frame to supportably guide a carrier frame and the associated CPU thereon. Anyhow, because the rail frame is required to be raised up with a distance for not interfering with the corresponding components on the PCB, there is a possibility for the transverse bar at the free end of the rail frame to damage the latches of the carrier frame or even the CPU during loading the carrier frame into the rail frame.

An electrical connector is desired to have some protection device around the transverse bar of the rail frame for preventing damage of the latches of the carrier frame or the CPU during assembling.

SUMMARY OF THE INVENTION

An object of the invention is to provide an electrical connector for connecting a CPU to a PCB. The connector includes a stiffener, a rail frame pivotally mounted to one end of the stiffener, a carrier frame assembled to the rail frame in a sliding manner, and a load plate pivotally mounted to the end of the stiffener outside of the rail frame. The carrier frame includes latches to retain the CPU thereon. The rail frame includes a pair of opposite sliding channels extending in the front-to-back direction, along which the carrier frame is moveable. The rail frame further includes a pair of guiding sections at the front ends of the pair of sliding channels with a curvedly expansion opening. A front transverse bar is located around and above the guiding sections for reinforcing the rail frame while not blocking assembling the carrier frame and the associated CPU thereto.

DETAILED DESCRIPTION OF THE PREFERRED EMBODIMENT

Figure 1:
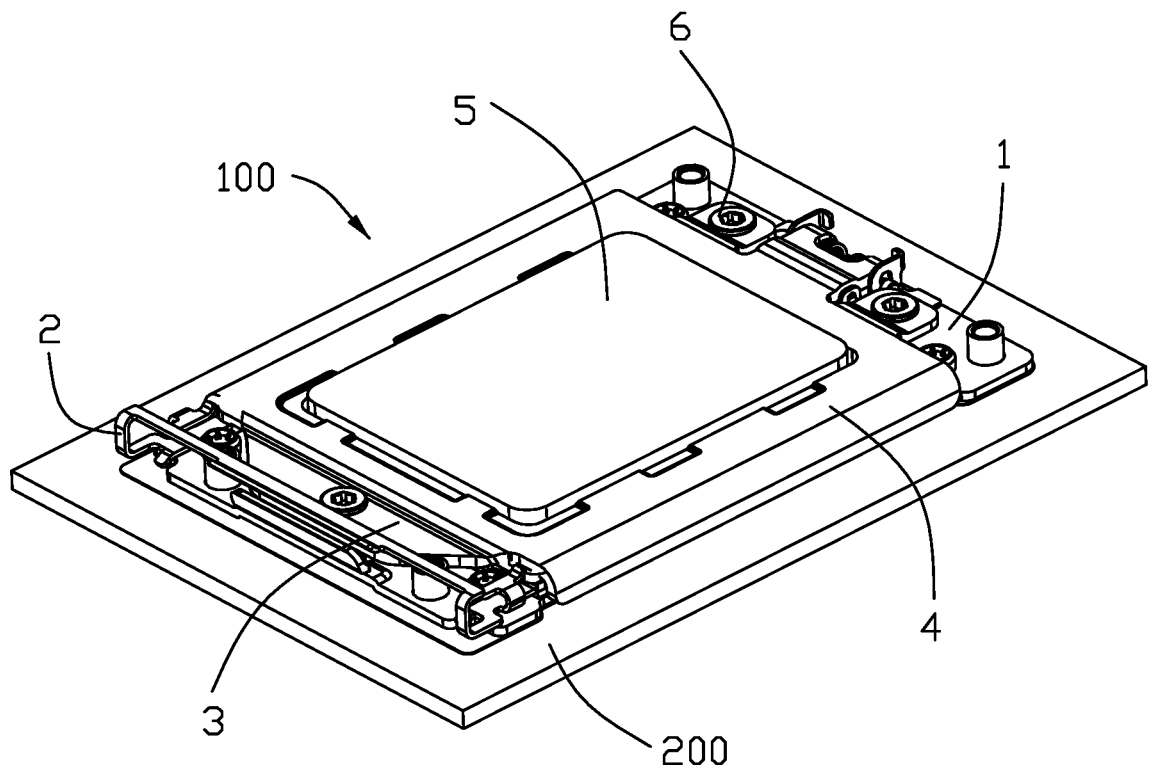
FIG. 1 is a perspective view of an electrical connector assembly in a closed state according to the invention.
Figure 2:
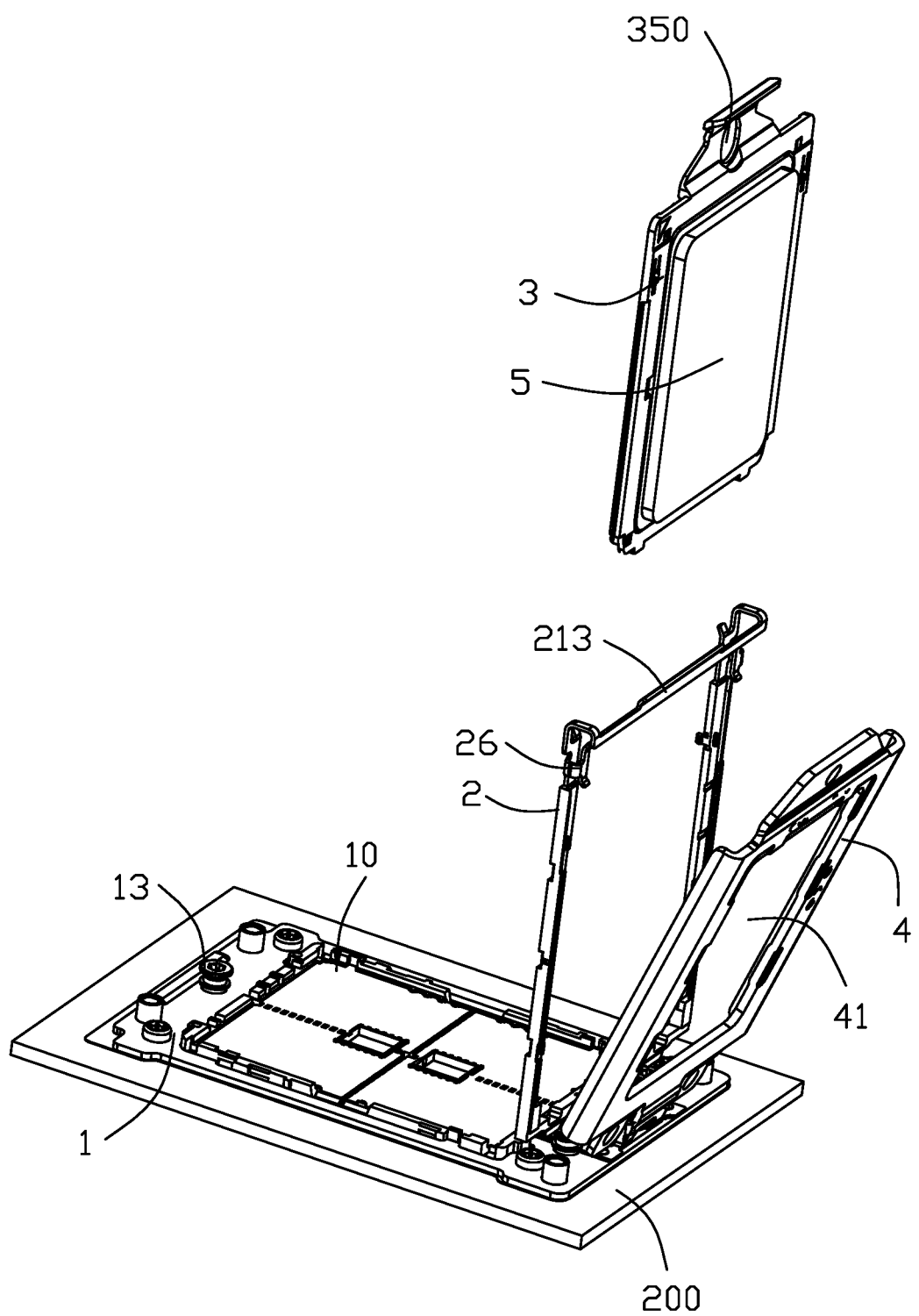
FIG. 2 is a perspective view of the electrical connector assembly of FIG. 1 in an open state.
Figure 3:
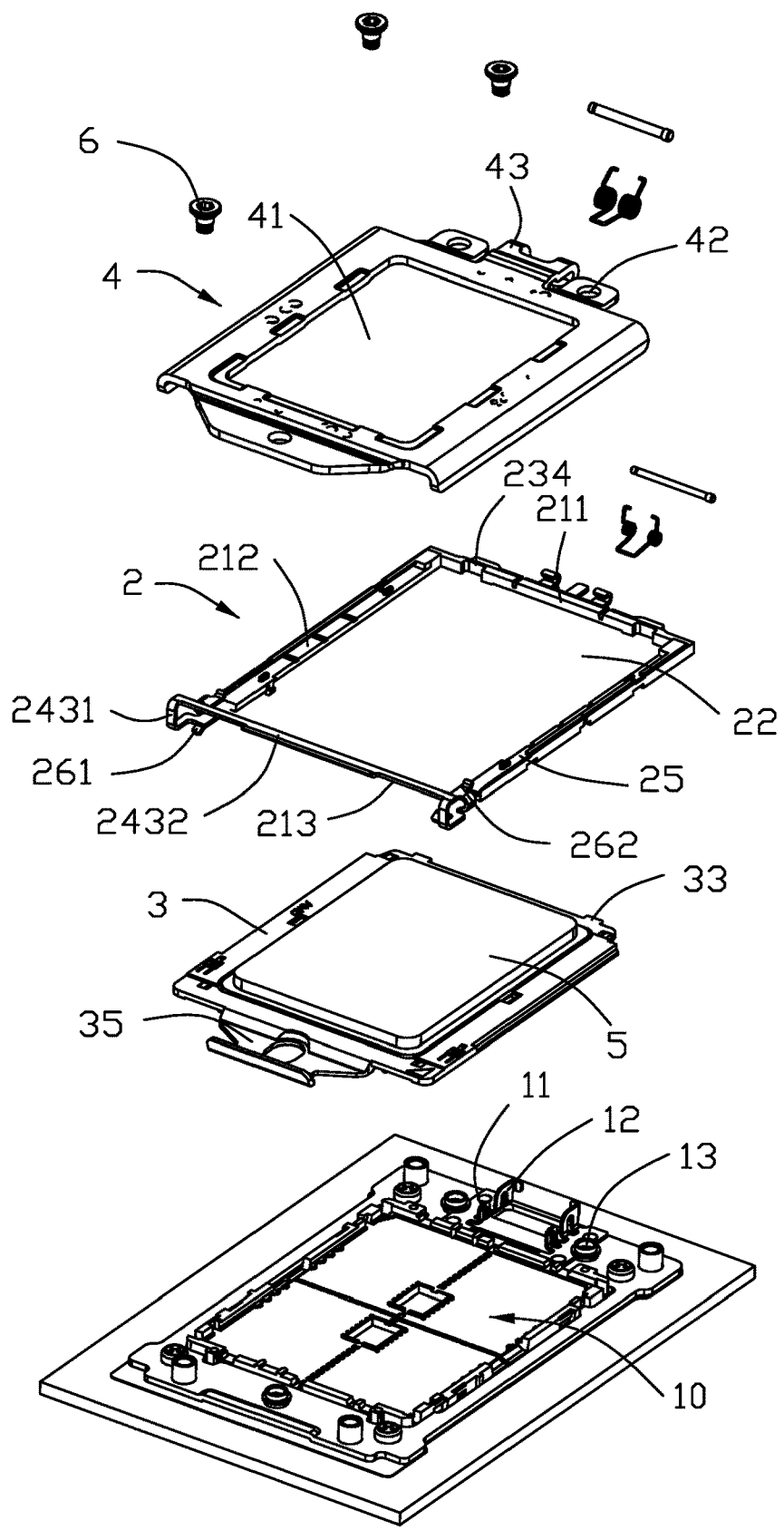
FIG. 3 is an exploded perspective view of the electrical connector assembly of FIG. 1.
Figure 4:
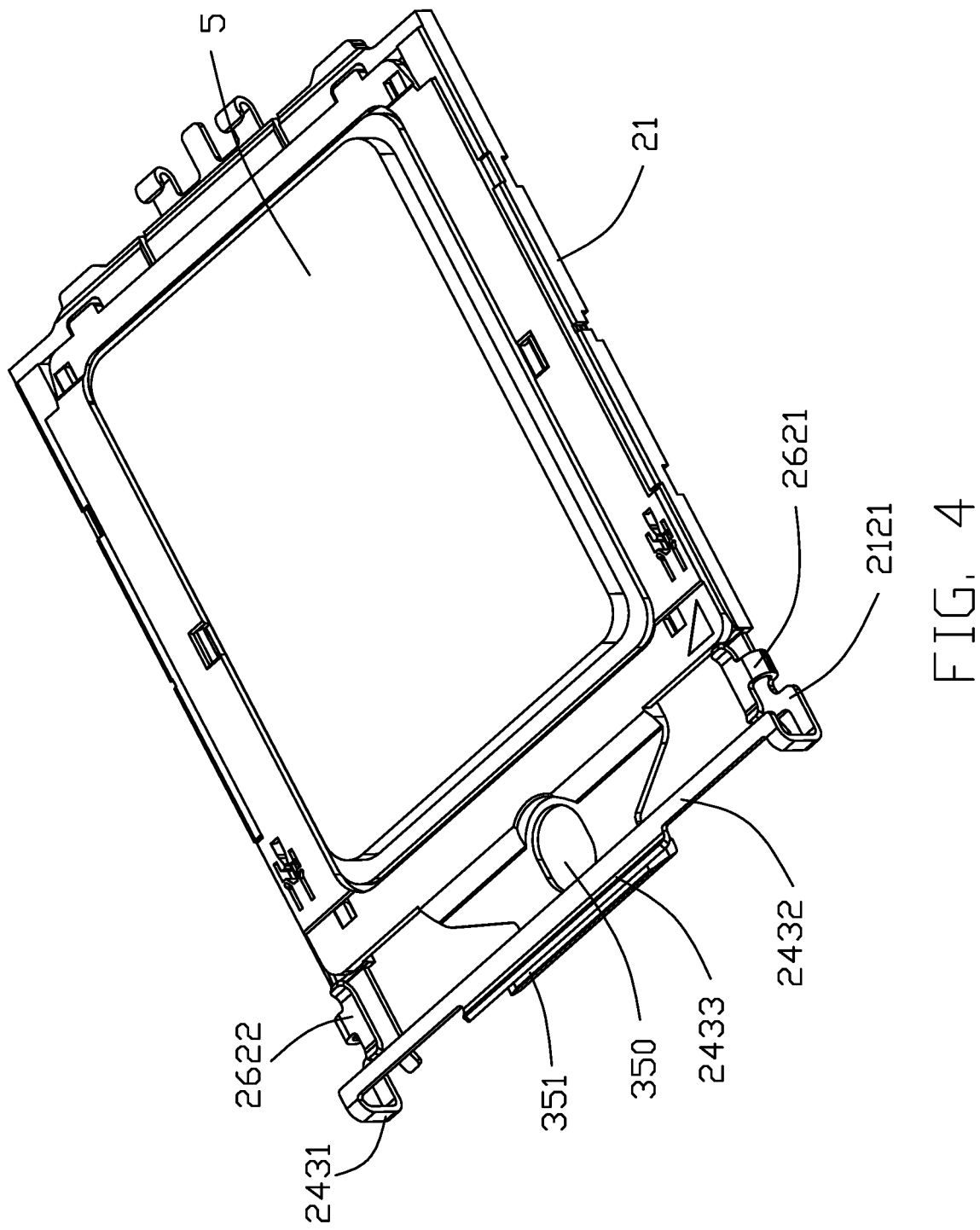
FIG. 4 is a perspective view of the carrier frame with the associated CPU received within the rail frame of the electrical connector assembly of FIG. 3.
Figure 5:
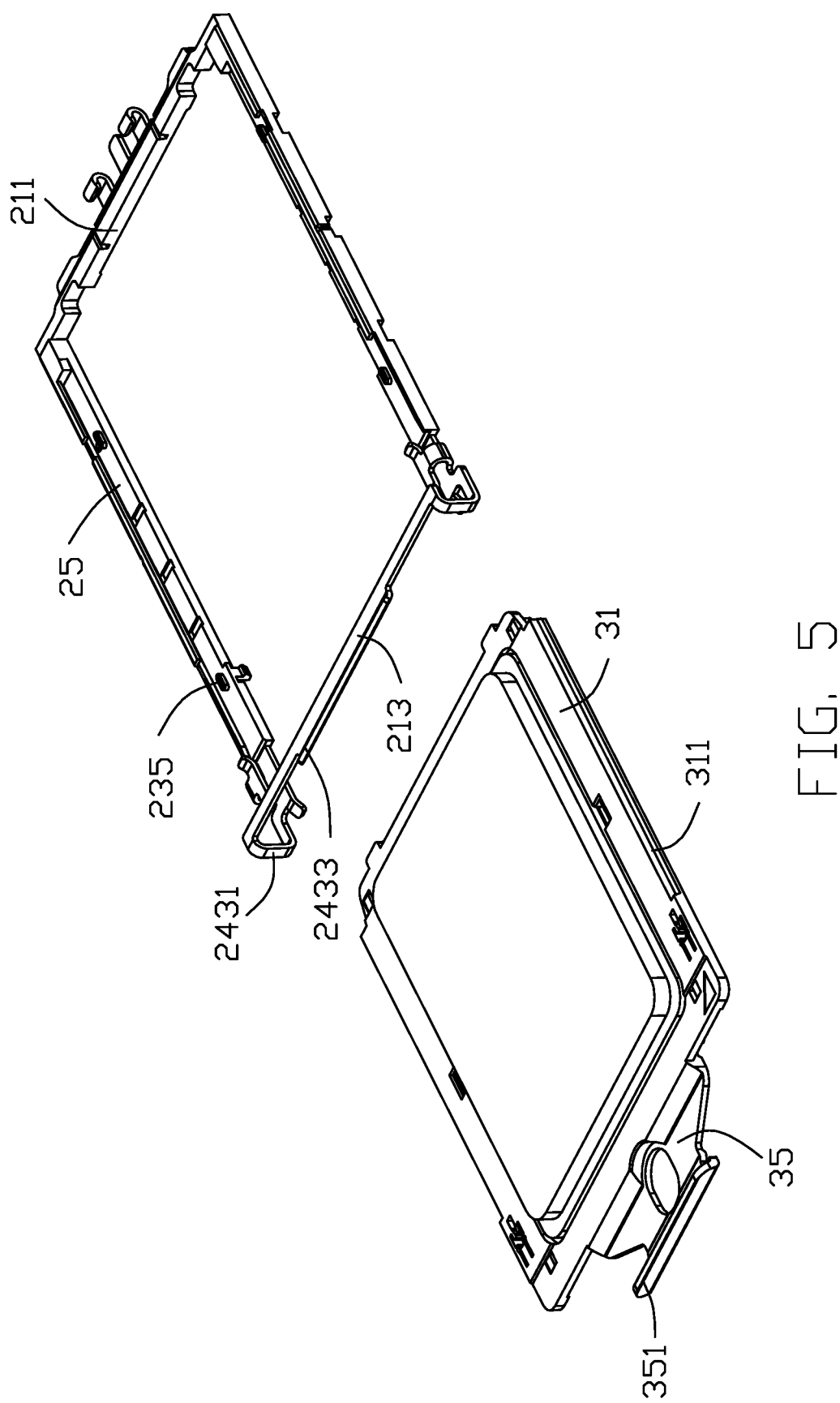
FIG. 5 is a perspective view of the carrier frame with the associated CPU removed away from the rail frame of the electrical connector assembly of FIG. 4.
Figure 6:
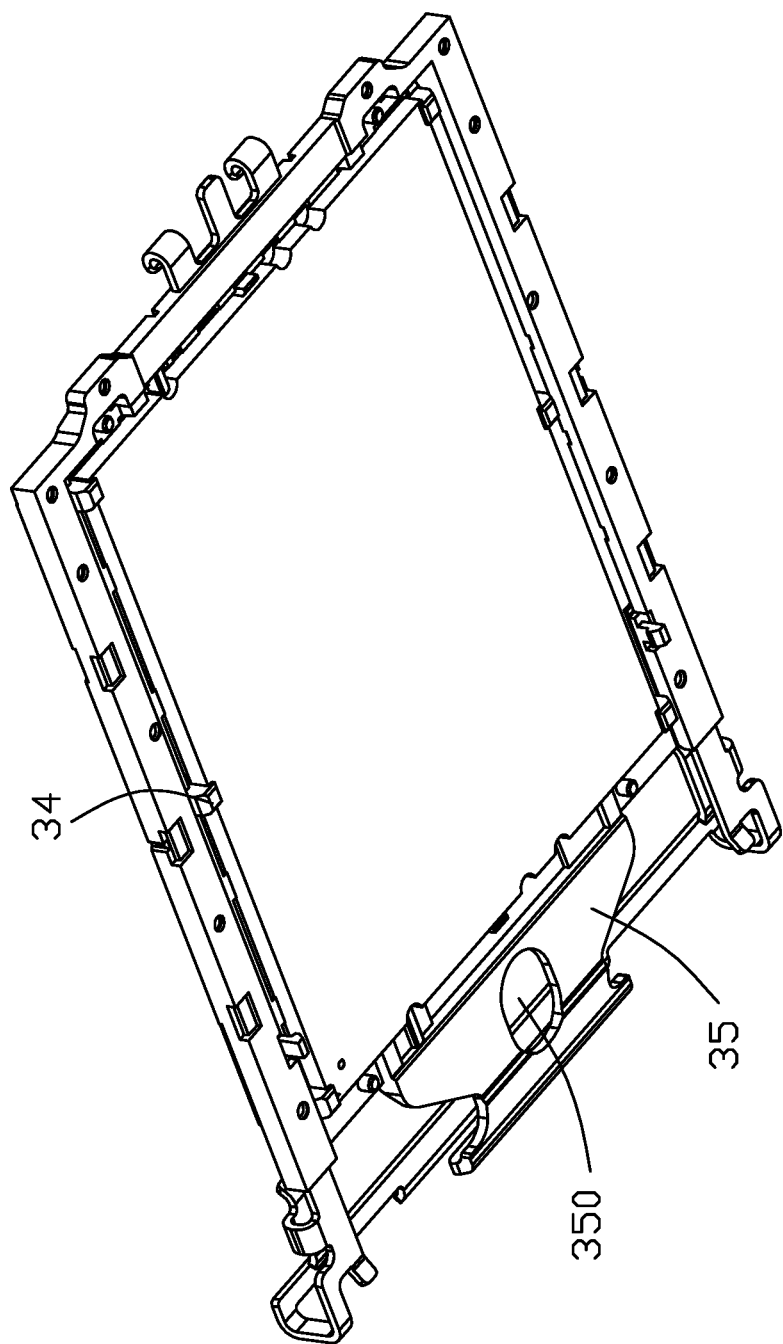
FIG. 6 is another perspective view of the carrier frame with the associated CPU received within the rail frame of the electrical connector assembly of FIG. 4
Figure 7:
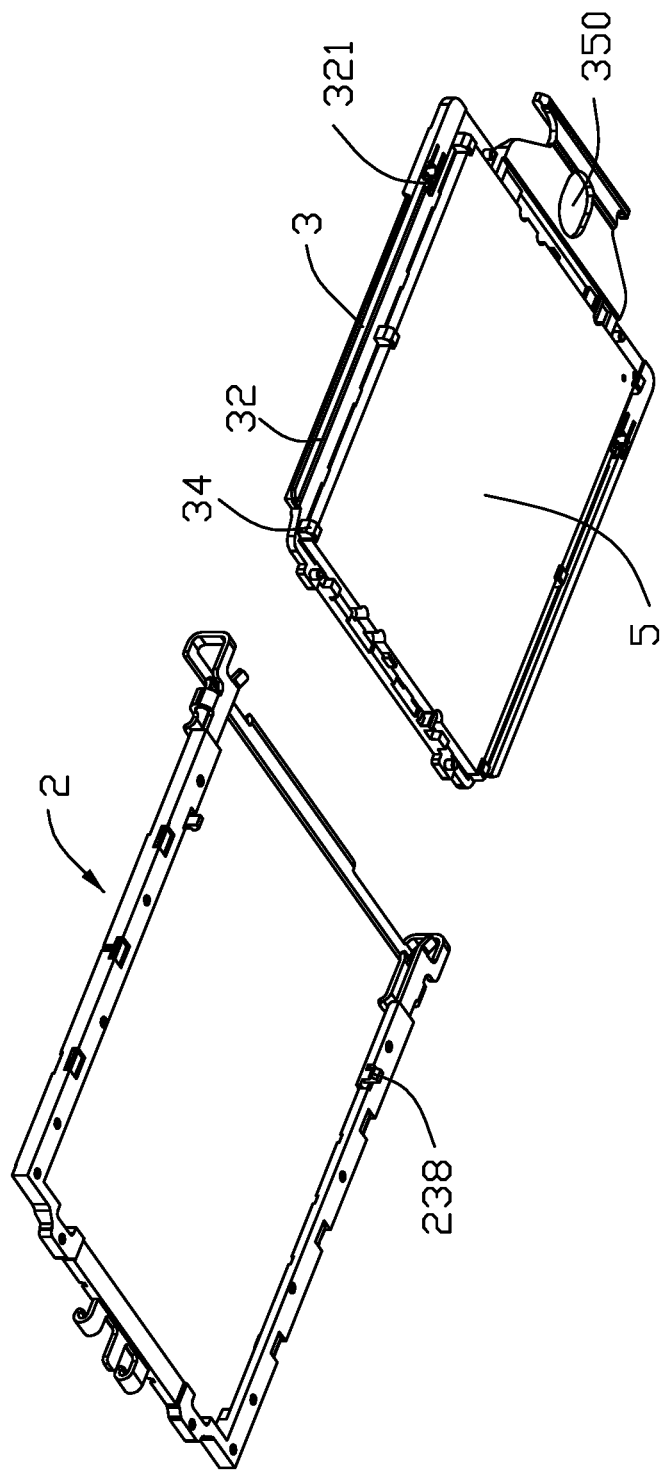
FIG. 7 is another perspective view of the carrier frame with the associated CPU removed away from the rail frame of the electrical connector assembly of FIG. 5.
Figure 8:
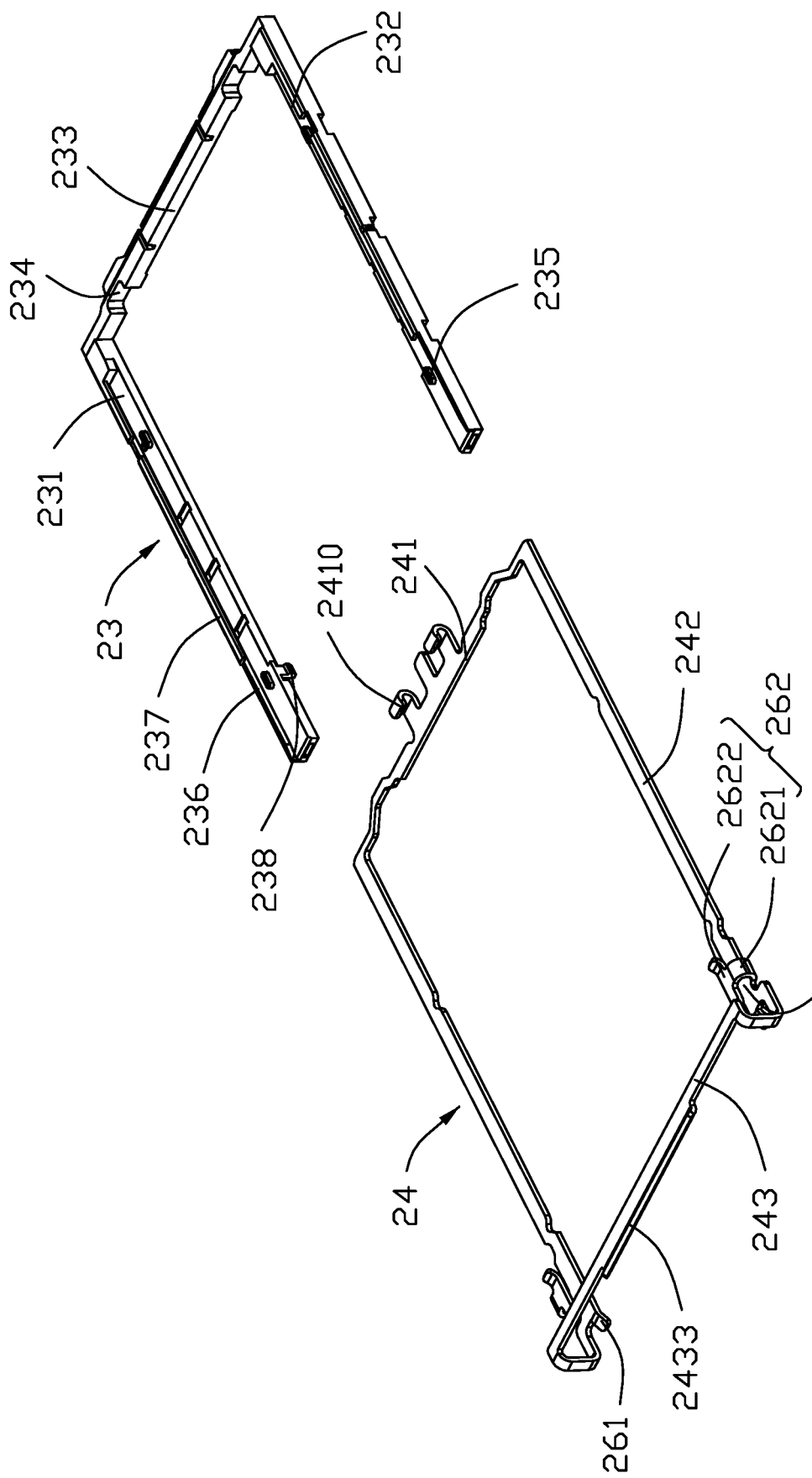
FIG. 8 is an exploded perspective view of the rail frame.
Figure 9:
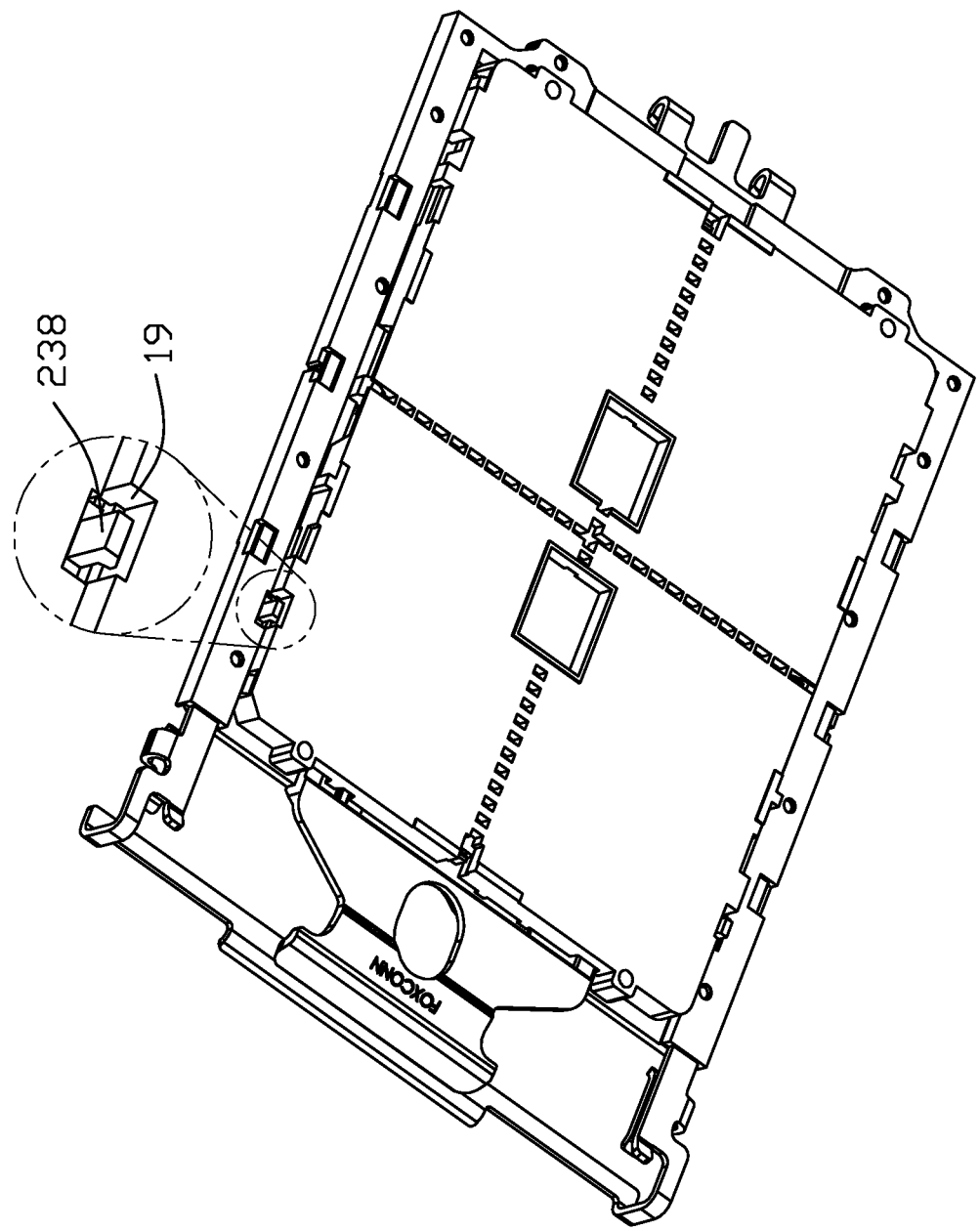
FIG. 9 is an upward perspective view of the connector unit and the rail frame of the electrical connector of FIG. 1 to show how the rail frame is engaged with the connector unit.

Referring to FIG. 1-8, an electrical connector assembly 100 for receiving a CPU 5 therein for electrically connecting to a PCB 200, includes a metallic stiffener 1 mounted to the PCB, a rail frame 2 pivotally mounted to a rear end of the stiffener 1, a carrier frame 3 assembled to the rail frame 2 in a sliding manner, and a load plate 4. Notably, a connector unit 10 is located in the space surrounded by the stiffener 1 so as to receive the CPU 5 therein during operation.

The stiffener 1 has a first pivotal section 11 and a second pivotal section 12. The rail frame 2 is pivotally mounted upon the first pivotal section 11, and the load plate 4 is pivotally mounted upon the second pivotal section 12. The CPU 5 is adapted to be retained upon the carrier frame 3 so as to be further assemble to the rail frame 2 via the carrier frame 3 and downwardly pressed by the load plate 4. A pair of fastening devices or screws 13 downwardly press the rear end of the load plate 4, and another fastening device 13 downwardly presses the front end of the load plate 4.

The rail frame 2 includes a bar sub-assembly 21 forming an opening 22. The bar subassembly 21 includes a first/rear (transverse) bar 211 at a rear end, a pair of second/side (elongated) bars 212 on two lateral sides, and a third/front (transverse) bar 213 at a front end. A pair of sliding channels 25 are formed in the pair of second bars 212. A guiding section 26 is formed at a front end of each sliding channel 25.

The third bar 213 includes a vertical section 2431 extending from the corresponding second bar 212, a horizontal section 2432 backwardly extending from the vertical section 2431, and a flaring section 2433 formed on the horizontal section 2431. The horizontal section 2432 is parallel to the first bar 211 and higher than the load plate 4 and the carrier frame 3. The second bar 212 includes a connecting section 2121 linked to the third bar 213.

In this embodiment, the rail frame 2 is composed of the metal piece 24 embedded within an insulator 23 via an insert-molding process for strength consideration.

The insulator 23 is of a U-shaped configuration, including a side arm 231, another side arm 232 and a rear arm 233 linking those two side arms 231 and 232. The rear arm 233 forms a pair of recesses 234. The sliding channel 25 is essentially formed by the side arm 231 and 232 each with a dimple 235 therein. Each of the side arms 231, 232 includes a first wall 236 and a second wall 237. Each side arm 232 forms a hook 238 for engagement within a recess 19 formed in an underside of the connector unit 10 when the rail frame 2 is moved to the horizontal position.

The metal piece 24 is of a frame structure, including a pair of side rods 242, a rear rod 241 and a front rod 243. The front rod 2243 abuts against the front end of the stiffener 1 and results in the front bar 213. The side rods 242 cooperate with the side arms 231, 232 via insert-molding to form the side bars 212. The rear rod 241 cooperates with the rear arm 233 via insert-molding to form the rear bar 211. The rear rod 241 forms a pair of bending sections 2410 to be pivotally mounted upon the first pivotal section 11.

The aforementioned guiding section 26 unitarily extends from the side rod 242 and includes a first/bottom guiding section 261 and a second/top guiding section 262 opposite to each other in the vertical direction. The first guiding section 261 flares downwardly. The second guiding section 262 includes a bending section 2621 extending from the side rod 242, and an extension 2622 extending from the bending section 2621 so as to cooperate with the first guiding section 261 for forming an enlarged guiding entrance 27. Notably, the extension 2622 is equipped with the flared structure at two opposite ends for easy insertion and withdrawal consideration. The side rod 242 also forms another outwardly and forwardly flared structure to cooperate with the extension 2622 to form the enlarged guiding entrance 27. The guiding section 26 is located in front of the corresponding sliding channel 25. The front rod 243 is slightly higher than the second guiding section 262. Understandably, when the carrier frame 3 and the associated CPU 5 are commonly inserted into the rail frame 2, the carrier frame 3 is guidably moved by the guiding section 26 initially into the entrance 27 and successively into the sliding channel 25 constrained by the first wall 236 and the second wall 237.

The load plate 4 is made of metal, and includes a cavity 41 to receive the CPU 5 therein. The load plate 4 includes a pivotal section 43 pivotally mounted to the second pivotal section 12. The load plate 4 further includes three fastening holes 42 cooperating with the fastening devices 13 to fasten the load plate 4 in position upon the stiffener 1.

The carrier frame 3 is made of plastic, being in a frame structure. The carrier frame 3 includes an opening to receive the CPU 5, and a pair of sliding sides 311. The carrier frame 3 with the associated CPU 5 is guided, via the guiding section 26, to enter, from the entrance 27, the corresponding sliding channel 25 by means of the sliding sides 311. The carrier frame 3 includes a pair of sliding slots 32 to cooperate with the dimple 235 for guiding sliding of the carrier frame 3 along the channels 25. A fixing hole 321 is formed in the sliding slot 31 for retainably receiving the dimple 235 when the carrier frame 3 is moved to the final position. A pair of posts 33 of the carrier frame cooperate with the recesses 234. The carrier frame 3 includes a plurality of latches 34 for engagement with a bottom surface of the CPU 5. In this embodiment, the latches 34 of the carrier frame 3 are located little lower than the hooks 238 of the rail frame 2 A handle 35 is formed at a front end of manual use of the user. An opening 350 is formed in the handle 35 and aligned with the fastening hole 42 for extension of the corresponding fastening device 6. An upwardly flaring section 351 is formed on the handle 35, and located below the flaring section 2433 of the third bar 213.

During assembling, the CPU 5 is assembled to the carrier frame 3 firstly. The carrier frame 3 and the associated CPU 5 are commonly inserted into the entrance 27 to move along the sliding channel 25 until the dimples 235 are retained in the corresponding fixing holes 321. The rail frame 2 is rotated downwardly to have the connecting sections 2121 seated upon the stiffener 1 and the hook 238 engaged with the corresponding recess 19 of the connector unit 10 so as to have the CPU 5 properly mounted upon the connector unit 10 for electrical connection there between. The load plate 4 is downwardly rotated to the horizontal position and locked by the fastening device 6 and the fastening device 13.

The rail frame 2 is pivotally mounted to the first pivotal section 11 and the load plate 4 is pivotally mounted to the second pivotal section 12. Compared with the arrangement disclosed in the aforementioned copending application Ser. No. 16/258,687, the raised-up third bar 213 with the associated upwardly flaring section 2433 may function as a handler for up and down rotating the rail frame 2. In addition, the raised-up third bar 213 may prevent the potential interference between the latches 34 and the third bar 213 which is originally located at the lower level around the stiffener 1.

What is claimed is:

1. An electrical connector assembly comprising:
   a printed circuit board (PCB);
   a metallic stiffener secured upon the PCB;
   a connector unit mounted upon the PCB and surrounded by the stiffener;
   a load plate pivotally mounted on a first end of the stiffener;
   a rail frame pivotally mounted upon a second end of the stiffener and defining a pair of sliding channels;
   a carrier frame defining two lateral sides adapted to be sliding along the sliding channels for assembling or disassembling with regard to the rail frame, an opening with a latch aside adapted for retaining and receiving a Central Processing Unit (CPU) therein; and
   the rail frame being made of a metal piece integrally formed within an insulator via an insert-molding process, said metal piece including a pair of side rods with a pair of opposite guiding sections around a front end of the rail frame, and a transversely extending front rod connected between the pair of side rods at the front end of the rail frame; wherein
   said front rod is located at a level higher than the guiding sections in a vertical direction.

2. The electrical connector assembly as claimed in claim 1, wherein the pair of side rods include connection sections at a front end to connect to the front row, and said connecting sections are seated upon the stiffener when said rail frame is moved to a horizontal position.

3. The electrical connector assembly as claimed in claim 1, wherein said first end of the stiffener and said second end of the stiffener are of a same one.

4. The electrical connector assembly as claimed in claim 1, wherein the front row is rearward bent from the pair of side rods with a flared section extends forwardly.

5. The electrical connector assembly as claimed in claim 1, wherein said carrier frame includes latches for engagement of the CPU.

6. The electrical connector assembly as claimed in claim 5, wherein the rail frame includes a hook which are engaged with the connector unit and positioned little higher than the latch of the carrier frame in the vertical direction.

7. The electrical connector assembly as claimed in claim 1, wherein the carrier frame includes a handle at a front end, and the front row is located above the handle so as to protect the handle in the vertical direction.

8. The electrical connector assembly as claimed in claim 7, wherein the front row is further equipped with a forwardly flared section for easy handling.

9. The electrical connector assembly as claimed in claim 1, wherein each guiding section unitarily extends from the corresponding side rod with a bending section and an extension, and the extension forms a forwardly flared structure for enlarging a corresponding entrance.

10. The electrical connector assembly as claimed in claim 9, wherein said extension further includes a rearward flared structure for easy withdrawal of the carrier frame from the rail frame.

11. The electrical connector assembly as claimed in claim 9, wherein the side rod forms another outwardly and forwardly flared structure for cooperating with the forwardly flared structure of the extension to form said entrance.

12. An electrical connector assembly comprising:
a printed circuit board (PCB);
a metallic stiffener secured upon the PCB;
a connector unit mounted upon the PCB and surrounded by the stiffener;
a load plate pivotally mounted on a first end of the stiffener;
a rail frame pivotally mounted upon a second end of the stiffener and defining a pair of sliding channels;
a carrier frame defining two lateral sides adapted to be sliding along the sliding channels for assembling or disassembling with regard to the rail frame, an opening with a latch aside adapted for retaining and receiving a Central Processing Unit (CPU) therein; and
said rail frame including opposite front and rear bars with a pair of side bars linked therebetween, each side bar including a guiding section at a front end with a flared structure thereof for enlarging a corresponding insertion entrance thereabouts; wherein
the front bar is located at a level higher than the guiding sections in a vertical direction.

13. The electrical connector assembly as claimed in claim 12, wherein said carrier frame includes latches for engagement of the CPU.

14. The electrical connector assembly as claimed in claim 13, wherein the rail frame includes a hook to be engaged with a recess of the connector unit when the rail frame is rotated downwardly to a horizontal position.

15. The electrical connector assembly as claimed in claim 14, wherein the latch downwardly extends lower than the latch.

16. The electrical connector assembly as claimed in claim 12, wherein the rail frame is made of a metal piece integrally formed within an insulator via an insert-molding process, and the guiding sections are made by the metal piece.

17. The electrical connector assembly as claimed in claim 16, wherein each guiding section unitarily extends from the corresponding side rod with a bending section and an extension, and the extension forms a forwardly flared structure for enlarging said insertion entrance.

18. The electrical connector assembly as claimed in claim 17, wherein the guiding section also forms a rearwardly flared structure for easy withdrawal of the carrier frame from the rail frame.

19. The electrical connector assembly as claimed in claim 17, wherein each side rod further includes a forwardly flared structure vertically opposite to that formed on the extension so as to form said insertion entrance therebetween in the vertical direction.

* * * * *